United States Patent [19]

Chen

[11] Patent Number: 5,040,179
[45] Date of Patent: Aug. 13, 1991

[54] HIGH DATA RATE BCH ENCODER

[75] Inventor: Carson Chen, Foster City, Calif.

[73] Assignee: Loral Aerospace Corp., New York, N.Y.

[21] Appl. No.: 396,418

[22] Filed: Aug. 18, 1989

[51] Int. Cl.$^5$ ............................................. G06F 11/10
[52] U.S. Cl. .................................. 371/37.1; 371/37.8
[58] Field of Search .................... 371/37.1, 37.8, 37.6, 371/38.1, 39.1, 40.1

[56] References Cited

U.S. PATENT DOCUMENTS

| | | |
|---|---|---|
| 4,030,067 | 6/1977 | Howell et al. . |
| 4,064,483 | 12/1977 | Takezono et al. . |
| 4,142,174 | 2/1979 | Chen et al. . |
| 4,162,480 | 7/1979 | Berlekamp . |
| 4,312,069 | 1/1982 | Ahamed . |
| 4,468,769 | 8/1984 | Koga . |
| 4,502,141 | 2/1985 | Kuki . |
| 4,556,977 | 12/1985 | Olderdissen et al. . |
| 4,623,999 | 11/1986 | Patterson . |
| 4,694,455 | 9/1987 | Koga et al. . |
| 4,719,628 | 1/1988 | Ozaki et al. . |
| 4,958,349 | 9/1990 | Tanner ............................... 371/37.1 |

OTHER PUBLICATIONS

J. Mears, "High-Speed Error Correcting Encoder/Decoder", IBM TDB, vol. 23, No. 4, 10/1980, pp. 2135-2136.

*Primary Examiner*—Robert W. Beausoliel
*Attorney, Agent, or Firm*—Edward J. Radlo; Kenneth R. Allen

[57] ABSTRACT

An encoder for selected linear error correcting codes, such as a BCH code, uses relatively low-speed circuitry to generate parities for correcting the code. A parity matrix derived from the BCH generator matrix is provided as data to a generator vector whereby the generator vector is used as a logical shift function generator. When the logical shift function is applied to the rows of the parity matrix, columns of parity are shifted into an EXCLUSIVE-OR tree to produce the parity bit of the column. The parity bit of the column is then injected into a data stream forming the encoded symbol for transmission, attaching the parity word following the data word. The apparatus may be constructed making maximum use of the standard, commerically available, relatively low-cost integrated circuits, but it is nevertheless capable of operating at speeds in excess 1 GBPS.

12 Claims, 7 Drawing Sheets

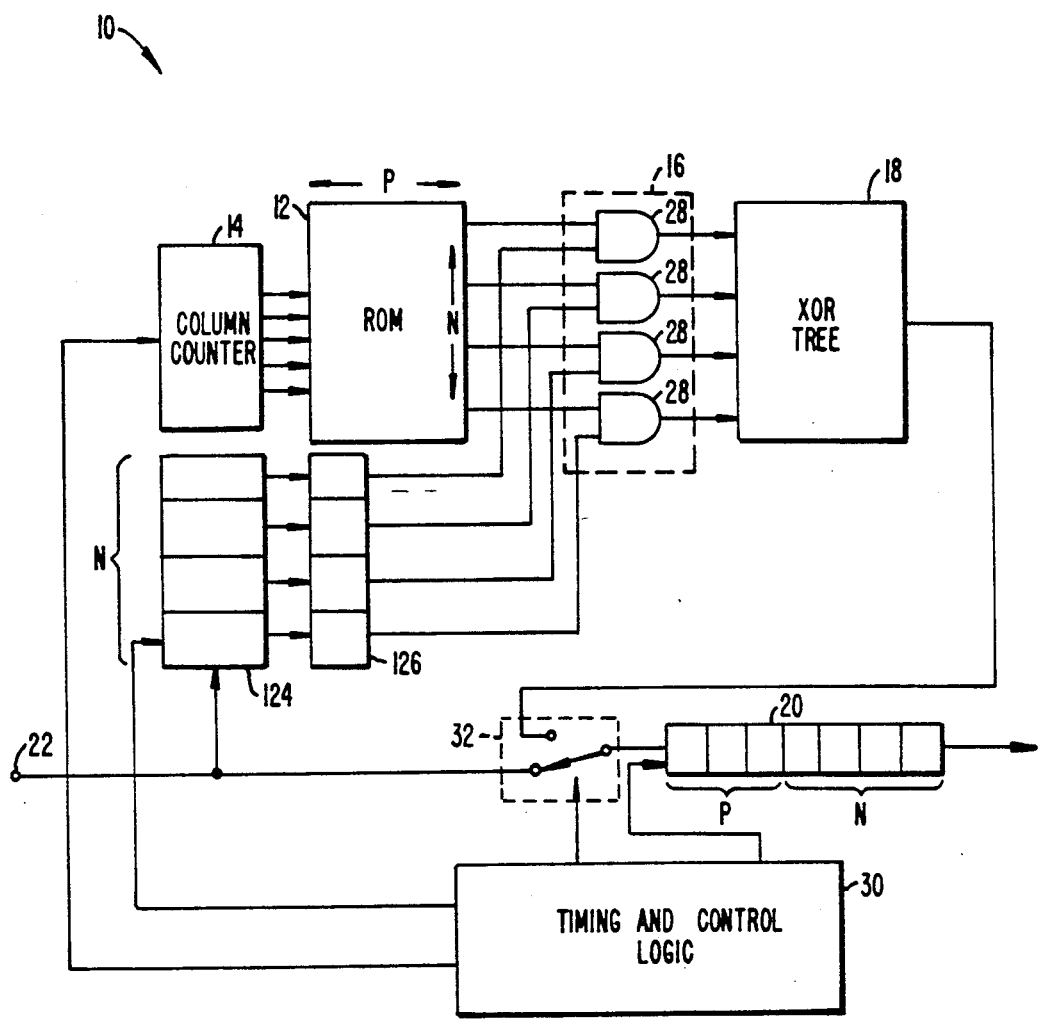
FIG._1.

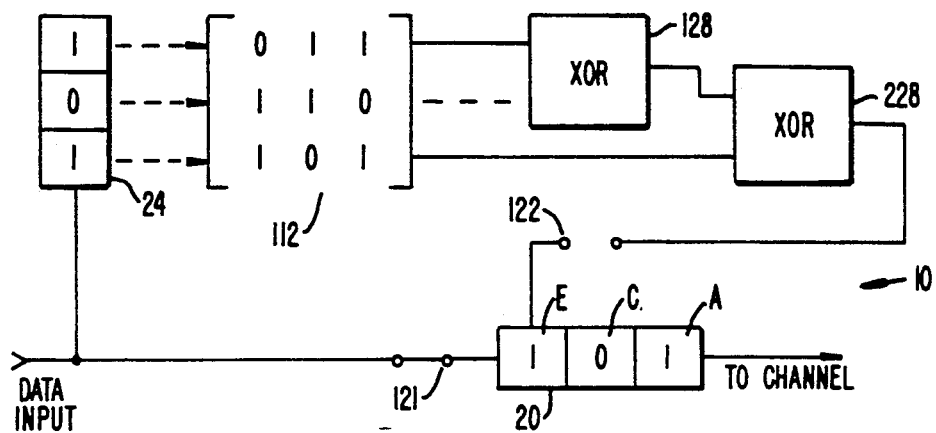
FIG._2.
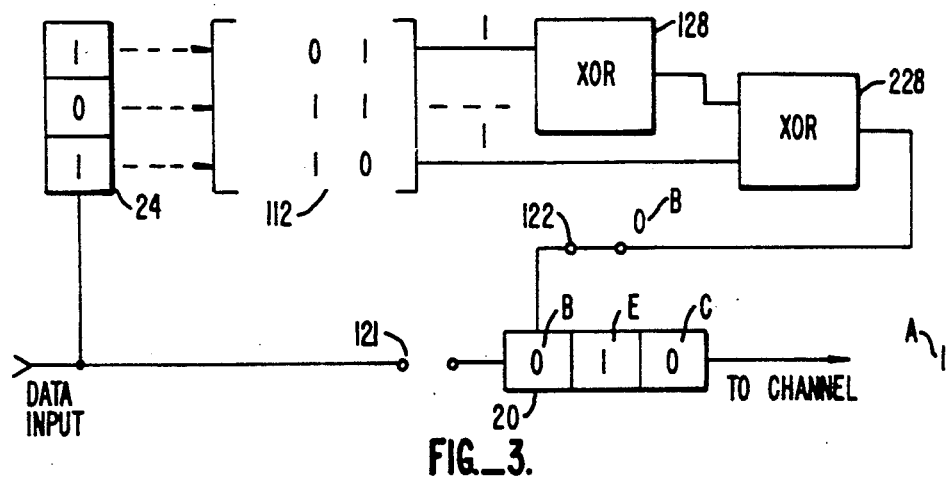
FIG._3.

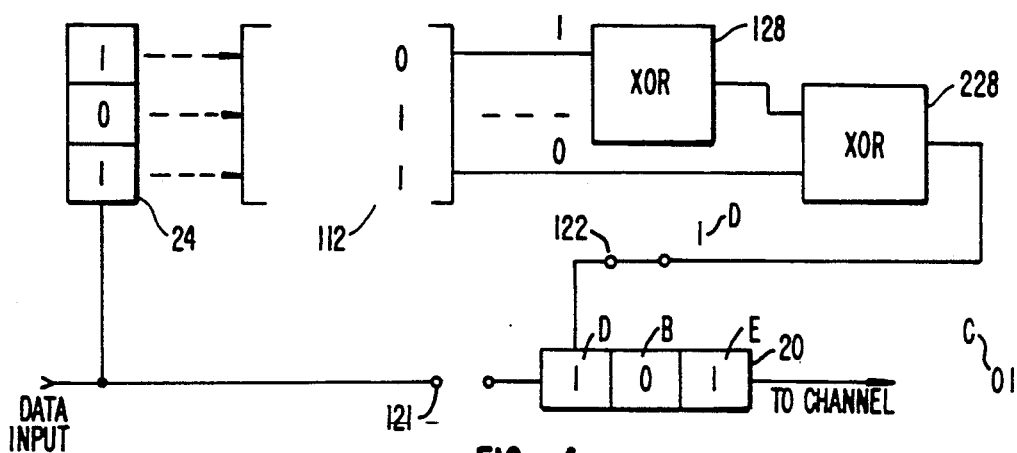
FIG._4.
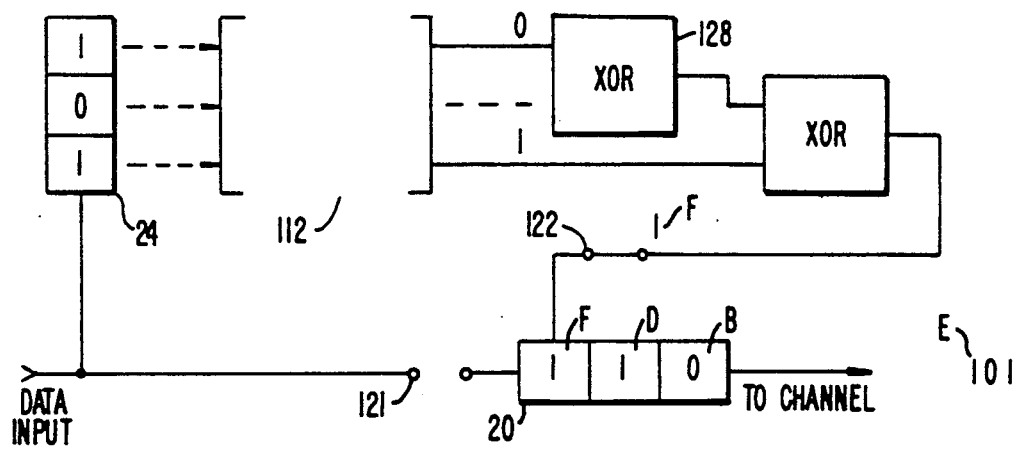
FIG._5.

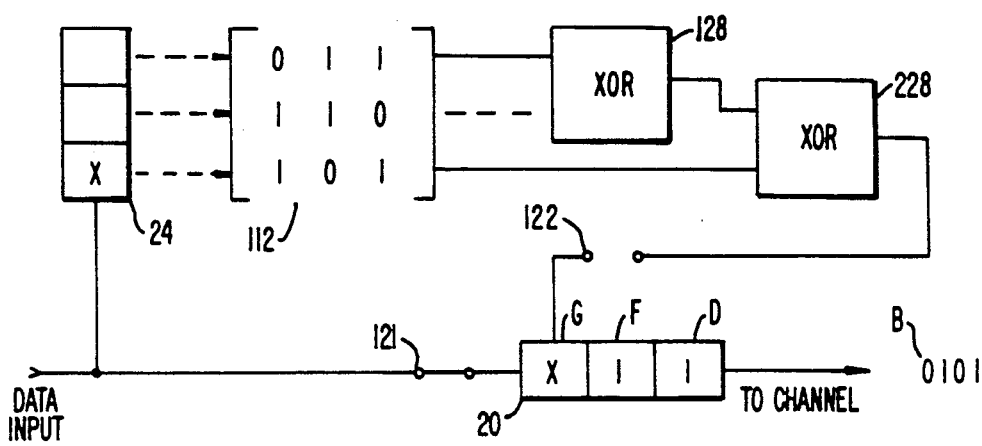
FIG._6.
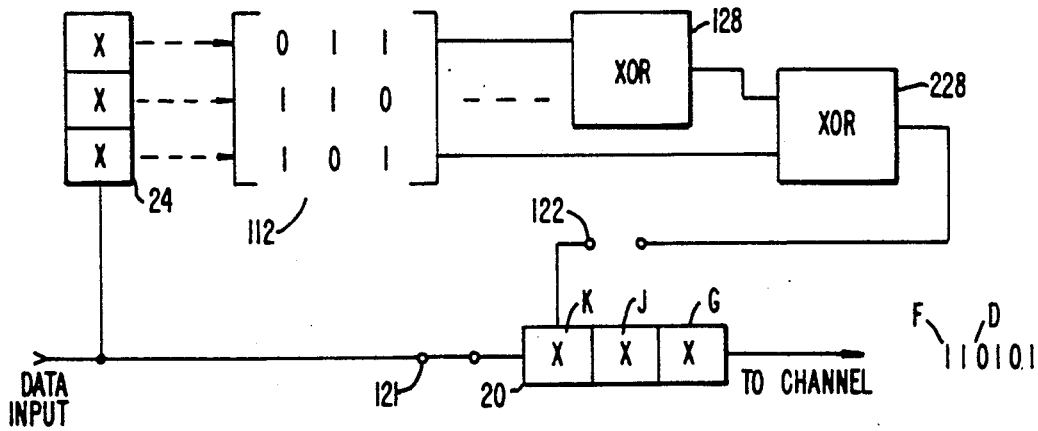
FIG._7.

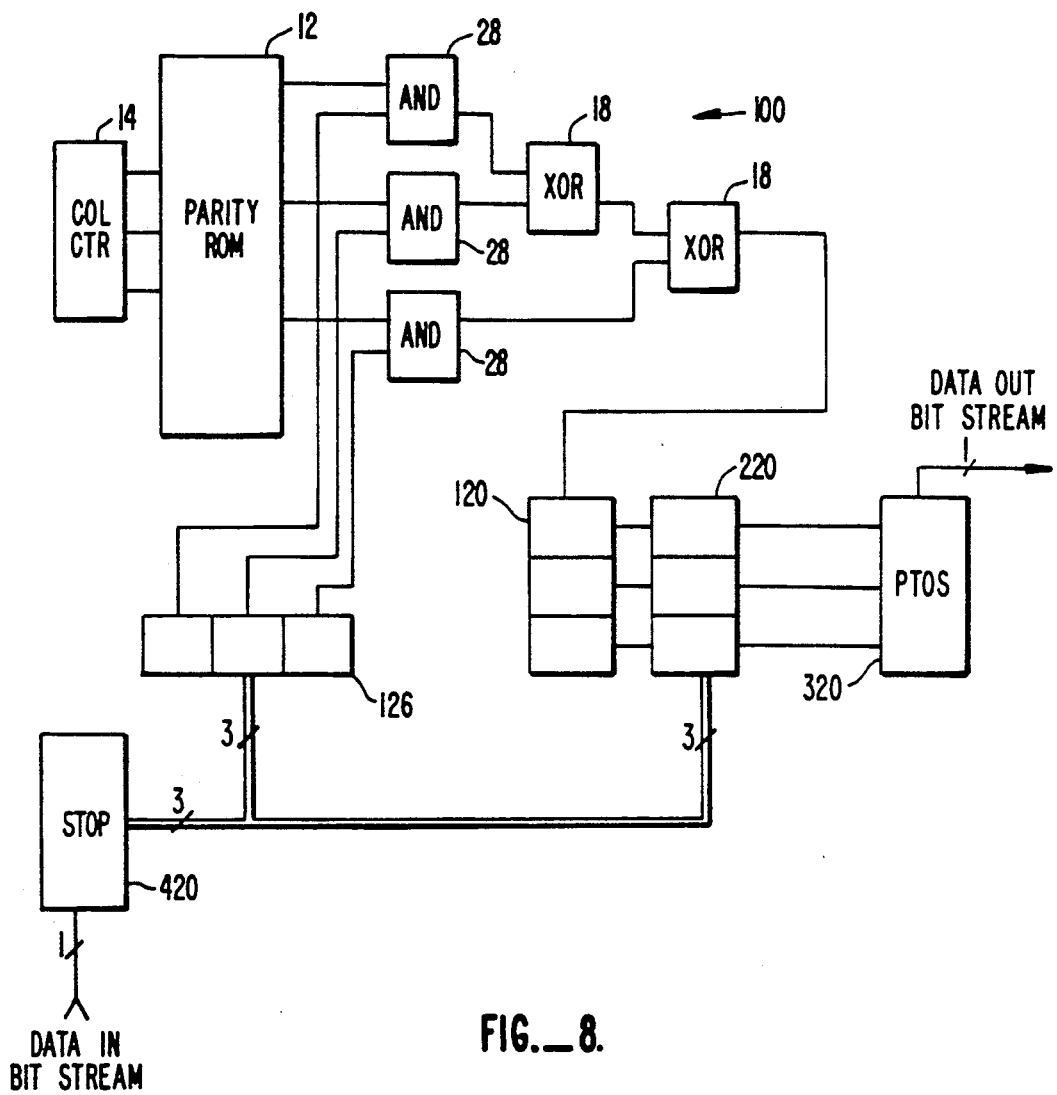
FIG._8.

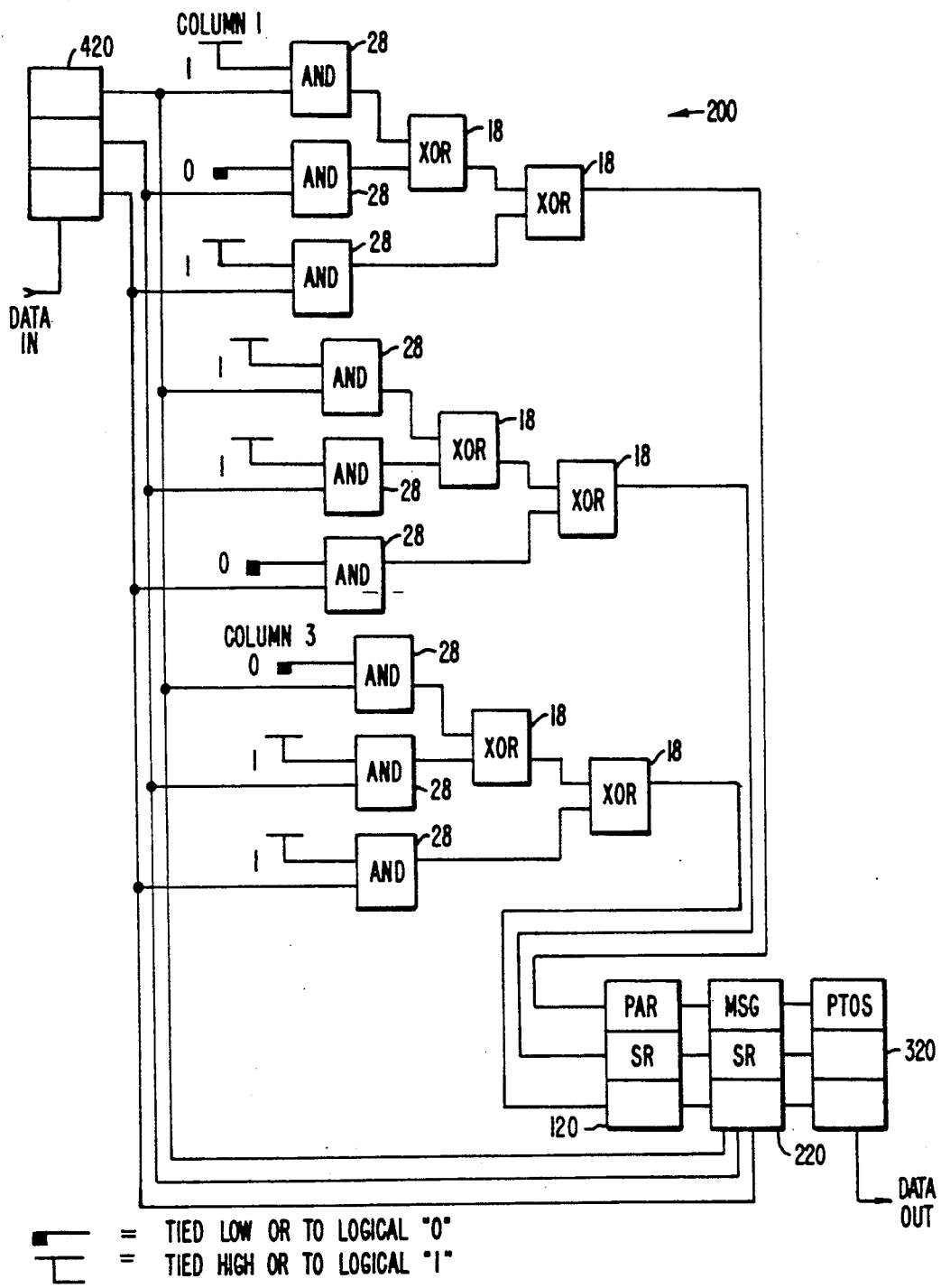
FIG._9.

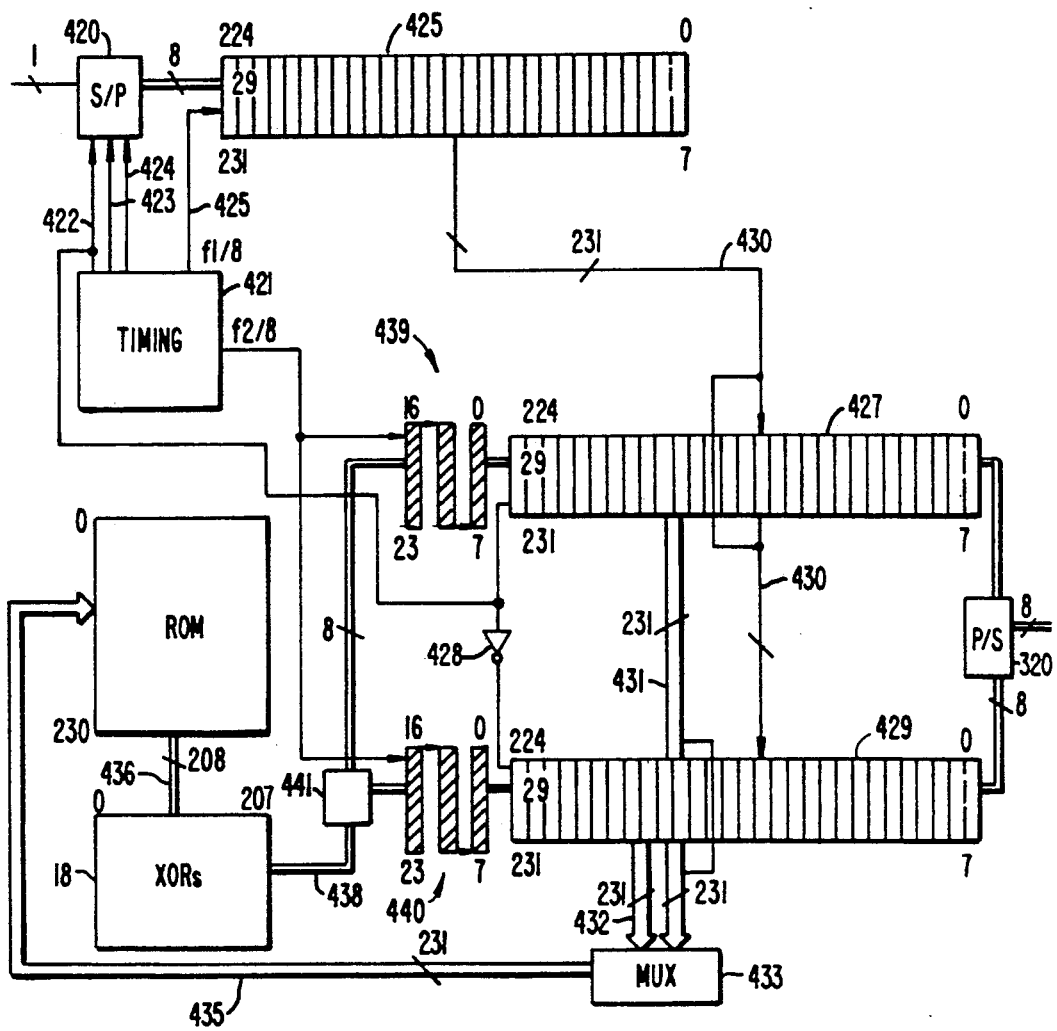
FIG._10.
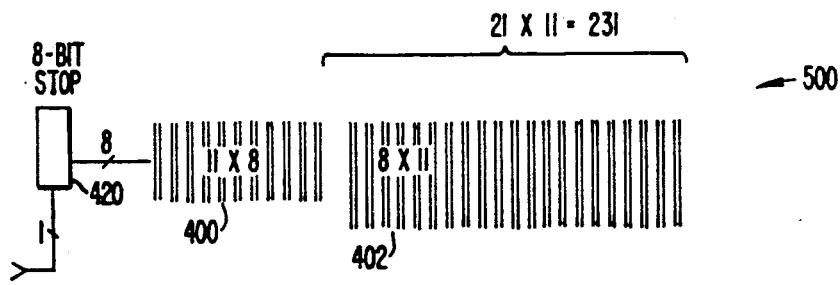
FIG._11.

HIGH DATA RATE BCH ENCODER

COPYRIGHT NOTICE

The subject disclosure contains material to which a claim of copyright protection is made. The owner of the copyrighted material has no objection to the facsimile reproduction of the copyrighted material as it appears in the disclosure but reserves all other rights whatsoever.

BACKGROUND OF THE INVENTION

This invention relates to encoding of data suited to error detection and correction, and more particularly this invention relates to encoding of data with a linear code or with selected linear cyclic codes whose generator polynomials can be factored. A primary example of a suitable code is a BCH code.

A BCH (Bose-Chaudhuri-Hocquenghem) code is an example of a code which can be used for correcting error bits in input data. These and other complex and powerful codes find use in satellite communication links and the like where error correction can be employed to mitigate the effects of noise interference. Such codes, however, require complex encoding and decoding algorithms. The complex encoding and decoding algorithms have typically been implemented by special-purpose computers which perform computations in real time.

As the need for very high-speed encoders has developed, the limitation of the computation technology has become apparent. Even with the most sophisticated high-speed digital logic circuits, the highest achievable data rate appears to be less than about 500 MBPS. There is nevertheless a need to develop encoders capable of supplying information in real time at rates in excess of 1 GBPS.

In order to understand the complexity of the problem, a brief explanation of the background and theory of the underlying encoding scheme is helpful. Reference may be had to works such as Berlekamp, *Algebraic Coding Theory*, (McGraw-Hill, 1968) or Lin & Costello, Jr., *Error Control Coding*, (Prentice-Hall, 1983).

A binary Bose-Chaudhuri-Hocquenghem code (or simply a BCH code) is a class of error detecting and error correcting codes having a code word length of $N = 2^m - 1$ where each symbol has m bits. The generator polynomial $g(x)$ is given by the form:

$$g(x) = 1 + X^2 + X^4 + X^5 + X^7 + X^8 + X^{13} + X^{15} + X^{16} + X^{17} + X^{19} + X^{20} + X^{21} + X^{23} + X^{24}$$

for a basic code having a code word or block length of 255 bits, of which 231 bits are information bits and 24 bits are parity check bits. The minimum distance of this code is $D = 7$. The generator polynomial is a product of the minimum polynomials $M_1(x)$, $M_3(x)$, and $M_5(x)$ of the roots $\alpha$, $\alpha^3$, and $\alpha^5$, as specified by the BCH code construction. The $\alpha$ is the primitive element of the Galois field, which in the case of this basic code is the Galois field $GF(2^8)$.

While the invention applies to linear error correcting codes and in specific embodiments to selected linear cyclic invariant codes whose generator polynomials can be factored, in order to simplify the explanation of the invention, the invention will be described specifically with respect to a triple-error-correcting binary BCH code. There are also special cases of BCH codes, such as Reed-Solomon codes, to which the concepts of the present invention may be applied.

The inventor wishes to call attention to the following references by way of background for the present invention. Not all of the references herein cited are necessarily prior art to the present invention.

| Author | U.S. Pat. No. | Issue Date |
| --- | --- | --- |
| Howell et al. | 4,030,067 | 06-14-77 |
| Takezono et al. | 4,064,483 | 12-20-77 |
| Chen et al. | 4,142,174 | 02-27-79 |
| Berlekamp | 4,162,480 | 07-24-79 |
| Ahamed | 4,312,069 | 01-19-82 |
| Koga | 4,468,769 | 08-24-84 |
| Kuki | 4,502,141 | 02-26-85 |
| Olderdissen et al. | 4,556,977 | 12-03-85 |
| Patterson | 4,623,999 | 11-18-86 |
| Koga et al. | 4,694,455 | 09-15-87 |
| Ozaki et al. | 4,719,628 | 01-12-88 |

Heretofore, virtually all BCH encoders have been based on an algorithm first described by Berlekamp, as noted in the above patent. The Berlekamp algorithm is a computation-intensive algorithm which was originally developed for relatively low-speed encoders.

The first step in the encoding computations is to compute the syndrome, or in the case of a triple-error-correcting BCH code, the three syndromes, referred to as S1, S3 and S5. There may be 24 bits in the syndromes in a typical example, which are the result of computations according to 24 parity check equations. The three syndromes are the remainders after the generator polynomial is divided by the polynomials $M_1(x)$, $M_3(x)$ and $M_5(x)$.

The syndromes are the values which contain the information needed to identify and locate any errors, and the syndromes are usually computed by dividing the received polynomial by the minimum polynomials using feedback shift registers.

Implementation of an encoder circuit at high speeds of interest, namely, greater than 500 MBPS, is extremely difficult because the propagation delay of a typical flip-flop plus the propagation delay of an EXCLUSIVE OR gate plus the setup time of the next flip-flop stage in a combinatorial logic encoder must be less than 2 nanoseconds. With currently-available commercial technology, this is possible only using expensive high-speed digital GaAs circuitry. Integrated circuits operating at speeds sufficient to support computation for data rates of greater than 1 GBPS are considered impossible to realize given the current state of the art of both digital circuitry and digital microwave techniques. Even if such circuitry were available, the current state-of-the-art techniques would require that each be individually customized, thereby essentially precluding the commercial development and large-volume availability of devices incorporating a high-speed BCH encoder. Therefore, novel technology is needed to overcome the problems inherent in computation-based encoders.

The conventional technique in pattern generation for translating syndrome patterns into error locations is a two-step approach using as a first step the Berlekamp algorithm referenced above, which translates the three syndromes into three error locator polynomial coefficients, and as a second step adding an error correction word to the polynomial coefficients based on the syndromes.

The use of a Read Only memory (ROM) has been suggested by Patterson in U.S. Pat. No. 4,623,999 in connection with the realization of BCH encoders. However, ROMs have only been suggested for use in support of specialized feedback and specialized computations of the conventional encoding method without departing substantially from the conventional encoding procedure.

If all encoding computations of a 255 bit, 231 codeword (255,231) BCH code were to be stored in a Read Only Memory, the size of the memory would be $2^{231}$, or $3.4 \times 10^{69}$ bits, which exceeds the storage capacity of the combination of all known computer memories. It is manifest that such an encoder is impractical. On the other hand, a computational system is far too slow for implementation at speeds in ranges exceeding about 500 MBPS.

Howell et al. describes a decoder which has an associated encoder employing a table of stored values corresponding to complete generator matrix and a complex EXCLUSIVE-OR tree. The circuitry includes certain computational tasks. The circuitry is by subsequent comparison highly redundant and thus requires the use of an excessive amount of circuitry.

Takezone is a decoder which uses cubic circuits employing Galois field arithmetic. There is no direct disclosure of encoding techniques or structures.

Chen et al. discloses a decoder for decoding Reed-Solomon codes, a special class of BCH codes. It does not disclose or suggest how to generate parity information.

Berlekamp '480 discloses a technique for generation of parity which teaches away from the invention as disclosed hereinafter. In the Berlekamp technique, the operation of multiplication, which is used to generate parity, is precomputed in Galois Field $2^5$ ($GF(2^5)$) and then expressed as precomputed values in combinatorial logic, as described in Table I of the patent.

Ahamed discloses serial binary division for generating parity bits. This requires a relatively long time delay to produce the desired parity values. As a consequence there is a speed limitation based on the excessive propagation delays.

Koga and Koga et al. describe decoders. The only references to encoding are to the work of others, which appear to rely on direct computation of parity.

Kuki describes another feedback shift register approach for generating the parity associated with a BCH code. It is slowed by its propagation through a classical feedback shift register and therefore is subject to inherent speed limitations.

Olderdissen et al. describes encoding with a specialized BCH coding scheme wherein a plurality of Read Only Memory elements is employed, each of the ROMs serving unique functions. There are at least two levels of ROM-based decoding to obtain the needed parity information for encoding. The speed of the encoding process is limited by propagation time through a nibble-oriented tree structure similar to a shift register.

Ozaki describes a multiple-step parity generation technique for use in encoding a BCH code. As with other prior art, there is an inherent delay due to the multiple step processing required, thereby constraining the speed of operation.

It would be desirable to minimize the amount of memory required to solve the encoding problem without sacrificing speed of processing.

In view of the limitations in the conventional approach to the solution of the BCH encoding problem, it is apparent that what is needed is an approach to encode BCH and like codes at speeds which are not limited by the computation apparatus or conventional memory limitations.

SUMMARY OF THE INVENTION

In accordance with the invention, an encoder is provided for selected linear error correcting codes whose generator polynomials can be factored, such as a BCH code, and which uses relatively low-speed circuitry to determine syndromes. A parity matrix derived from the BCH generator matrix is provided as data to a generator vector whereby the generator vector is used as a logical shift function generator. When the logical shift function is applied to the rows of the parity matrix, columns of parity are shifted into an EXCLUSIVE-OR tree to produce the parity bit of the column. The parity bit of the column is then injected into a data stream forming the encoded symbol for transmission, attaching the parity word following the data word. In a specific embodiment, storage requirements of the parity matrix memory, which may be a Read Only Memory, are minimized, and simple shift operations are employed to speed apparent computation. The table look-up method avoids the complexity of error locating polynomials, algebraic root finders and real-time computation while reducing computation time. The apparatus may be constructed making maximum use of standard, commercially-available, relatively low-cost integrated circuits, but it is nevertheless capable of operating at speeds in excess 1 GBPS. Specifically, the invention is capable of generating code at the rate of a serial bit stream through a single bit shift register and is therefore limited only by the speed of the technology in which the shift register is realized.

This invention is suitable for use in an encoder for a BCH communication system using a decoder of the type described in copending U.S. patent application Ser. No. 07/265,625 filed Nov. 1, 1988 and assigned to Ford Aerospace Corporation, the assignee of the present invention. The invention can also be used in connection with other BCH or like decoders.

The invention will be more fully understood by reference to the following detailed description in connection with the accompanying drawings.

BRIEF DESCRIPTION OF THE DRAWINGS

FIG. 1 is a block diagram of a first embodiment of an encoder according to the invention.

FIG. 2 is a simplified block diagram representing an encoder according to the invention at a first state or clock cycle.

FIG. 3 is a simplified block diagram representing an encoder according to the invention at a second state or clock cycle.

FIG. 4 is a simplified block diagram representing an encoder according to the invention at a third state or clock cycle.

FIG. 5 is a simplified block diagram representing an encoder according to the invention at a fourth state or clock cycle.

FIG. 6 is a simplified block diagram representing an encoder according to the invention at a fifth state or clock cycle.

FIG. 7 is a simplified block diagram representing an encoder according to the invention at a sixth state or clock cycle.

FIG. 8 is a block diagram representing an encoder according to the invention employing column/row rotation.

FIG. 9 is a block diagram representing an encoder according to the invention employing a hardwired matrix.

FIG. 10 is a detailed block diagram of a specific implementation of a (255,231) BCH encoder according to the invention.

FIG. 11 is a diagram illustrating the formatting of a 231 bit long stream of a standard 8-bit serial-to-parallel converter.

DESCRIPTION OF SPECIFIC EMBODIMENTS

Referring to FIG. 1, the encoding process, which in the past has required direct computation of the syndromes, is accomplished according to the invention by use of a syndrome generation processor (a computer program) which produces as a result a simple parity matrix whose values are stored in a Read Only Memory 12 of an encoder 10. The syndrome generation processor precomputes a standard set of values for the predefined code word format from which the parity can be computed in accordance with the invention. The ROM 12 is of the number of rows equal to the codeword size N and the number of columns equal to the number of parity bits P. Its address input is provided by a recirculating counter 14, as hereinafter explained, whose function is to "count" the P columns whereby each column is separately addressed, and its data output is fed through an AND gate array 16 to an EXCLUSIVE-OR gate tree 18. The AND gate array is equal in size to the number of bits N in the code word. The EXCLUSIVE-OR gate tree 18 consolidates the N bits by combinatorial logic into a single bit, producing as an output a serial bit stream corresponding to the parity word of the code word. The serialized parity word is fed one bit at a time into an output shift register 20 such that it is appended to the code word previously loaded into the output shift register 20 from a code word source input 22. The output shift register 20 produces as its serial output the desired encoded digital data stream with a parity word suited to be used for error correction. According to the invention, the parity word is produced by ANDing the input code word with a predetermined column of the parity matrix. For this purpose, an input shift register 124 captures the input code word from the code word source input 22 and provides a needed one word delay in propagation, and a latch 126 samples the parallel output of the input shift register 124 to provide parallel input to one input port of each of the two-input AND gates 28 in the AND gate array 16. Timing and logic control means 30 are provided to control the input clock speed, the output clock speed, and the multiplexing of the input to the output shift register 20 through a switch 32. The output clock speed is greater than the input clock speed by a ratio equal to the ratio of the differential size of the input code word and the output code with parity word.

In order to understand the operation and derivation of a structure of any encoder in accordance with the invention, it is helpful to understand a portion of the mathematics applied to this invention. The invention relies on the use of the parity matrix, which is generated from the standard generator polynomial.

Computation of the syndromes if in real time would be as follows. The BCH code has a characteristic H matrix describing the parity check equations which make up the syndrome calculations. Specifically, by definition:

$$cH^T = 0$$

where c is the code word and $H^T$ is the transpose of the H matrix. The received code is r, which is a combination of the code word c plus a linear combination of some error e, or $r = c + e$. The syndrome is given by:

$$S = rH^T = cH^T + eH^T = eH^T.$$

Thus, the syndrome error is dependent only on the error pattern and not on the encoded information.

The H matrix for the BCH code of this example is a 24-row by 255-column matrix. The first eight rows correspond to the eight bits of the first syndrome $S_1$, the second eight rows correspond to the eight bits of the second syndrome $S_3$, and the third eight rows correspond to the eight bits of the third syndrome $S_5$.

The first row of the matrix represents the parity check equation for the first bit of $S_1$, the value of the first bit being given by the parity of the bit-by-bit product of the received code word and the first row of the H matrix, each of which are 255 bits long. The bit-by-bit product is the result of the Exclusive-ORing of the two. The received code word may be subdivided into sixteen-bit chunks, each of which may be processed in parallel with the corresponding sixteen-bit chunk of the corresponding row of the H matrix. After all sixteen partial parities have been computed (the 256th bit is ignored), they can be modulo-2 added to form the total parity, the result of which is the first bit of the first syndrome $S_1$. The same process is carried out for all of the other syndrome bits.

According to the invention, a parity matrix derived from the BCH generator matrix is provided as data to a generator vector whereby the generator vector is used as a logical shift function generator. When the logical shift function is applied to the rows of the parity matrix, columns of parity are shifted into an EXCLUSIVE-OR tree to produce the parity bit of the column. The parity bit of the column is then injected into a data stream forming the encoded symbol for transmission, attaching the parity word following the data word.

Only the parity matrix without the identity matrix is stored such that the parity matrix is very small. For a 255 bit BCH coding scheme (255,231) which uses 24 bits of parity, only $231 \times 24$ entries are required in the parity matrix, which is 5,544 bits in size.

In order to better understand the principle underlying the present invention, it is helpful to review the currently-known methods for coding a message vector and then to compare them with the present invention.

CODING USING STANDARD MATRIX MULTIPLY OPERATIONS

The simplest way to describe standard coding techniques is to give an example of the typical matrix operations that take place to generate a coded "information plus parity" input vector.

EXAMPLE

Consider a (6,3) coding scheme, consisting of 6 total bits per coded word, 3 information bits and $6 - 3 = 3$ parity bits. After conventional prior analysis has been completed, a generator matrix G is defined as:

$$G = \begin{bmatrix} g_1 \\ g_2 \\ g_3 \end{bmatrix} = \begin{bmatrix} 100110 \\ 010011 \\ 001101 \end{bmatrix}$$

Given this generator matrix, consider transmission of the message $m = (1\ 0\ 1)$. To assure that the message is transmitted error free, it is necessary to add the proper parity information to the message m prior to transmission. Thus, should an error occur during the transmission process, this permits reconstruction of the original message from the received error-ridden code word.

To produce a transmittable code word u, the message m is coded with the proper parity information defined by the generator matrix G. This is achieved by performing the matrix multiply and add operations as follows.

$$u = m * G$$

$$u = (101) \begin{bmatrix} g_1 \\ g_2 \\ g_3 \end{bmatrix}$$

$$= 1 * g_1 + 0 * g_2 + 1 * g_3$$

$$= (100110) + 0 + (00110)$$

$$u = 101011$$

The coding process is now complete and the code word u of the message m can now be sent out for transmission.

In more general terms, to produce a (n,k) code word u, the message vector m, and generator matrix G, operations take the following generalized form.

$$m = (m_0\ m_1\ m_2\ m_3\ \ldots\ m_{k-1})$$

$$G = \begin{bmatrix} g_0 \\ g_1 \\ g_2 \\ \vdots \\ g_{k-1} \end{bmatrix} = \begin{bmatrix} g_{00} & g_{01} & g_{02} & g_{03} & \cdots & g_{0,n-1} \\ g_{01} & g_{11} & g_{12} & g_{13} & \cdots & g_{1,n-1} \\ g_{20} & g_{21} & g_{22} & g_{23} & \cdots & g_{3,n-1} \\ \vdots & \vdots & \vdots & \vdots & & \vdots \\ g_{k-1,0} & g_{k-1,1} & g_{k-1,2} & g_{k-1,3} & \cdots & g_{k-1,n-1} \end{bmatrix}$$

$$u = (m_0\ m_1\ m_2\ m_3\ \ldots\ m_{k-1}) \begin{bmatrix} g_0 \\ g_1 \\ g_2 \\ \vdots \\ g_{k-1} \end{bmatrix}$$

$$= m_0 g_0 + m_1 g_1 + m_2 g_2 + m_3 g_3 + \ldots + m_{k-1} g_{k-1}$$

If it is desired to produce a (255,231) code word as herein, the matrix coding operations would analogously take the following form.

$$m = (m_0\ m_1\ m_2\ m_3\ \ldots\ m_{230})$$

$$G = \begin{bmatrix} g_0 \\ g_1 \\ g_2 \\ \vdots \\ g_{230} \end{bmatrix} = \begin{bmatrix} g_{00} & g_{01} & g_{02} & g_{03} & \cdots & g_{0,254} \\ g_{10} & g_{11} & g_{12} & g_{13} & \cdots & g_{1,254} \\ g_{20} & g_{21} & g_{22} & g_{23} & \cdots & g_{3,254} \\ \vdots & \vdots & \vdots & \vdots & & \vdots \\ g_{230,0} & g_{230,1} & g_{230,2} & g_{230,3} & \cdots & g_{230,254} \end{bmatrix}$$

$$u = (m_0\ m_1\ m_2\ m_3\ \ldots\ m_{230}) \begin{bmatrix} g_0 \\ g_1 \\ g_2 \\ \vdots \\ g_{230} \end{bmatrix}$$

$$= m_0 g_0 + m_1 g_1 + m_2 g_2 + m_3 g_3 + \ldots + m_{230} g_{230}$$

These coding operations can be performed as described by using a microprocessor or feedback shift register, but as described above there are speed limitations to these approaches which are addressed by the present invention.

CODING USING ROM TABLE LOOK UP

As described above, a fast, convenient way to perform the coding operation is simply to store all combinations of the message vector and its associated parity equivalent in a ROM for future look up. Using the first (6,3) code word example, the lookup table is fairly tameable, i.e., the maximum probable combinations of the message word is $2^3 = 8$ and therefore the total number of combinations to store the generator/parity matrix equivalent would require $8 \times 3$ bits = 24 bits of ROM.

If extended to application of type intended for this invention, the (255,231) code word would require $2^{231} = 3.45 \times 10^{69}$ combinations of 231 bit message words and therefore requires $(3.45 \times 10^{69}) \times 24$ bits $= 8.282 \times 10^{70}$ bits of table look up ROM. Aside from the speed issues of using e.g. CMOS technology, this is a prohibitive amount of memory that makes this approach highly impractical.

EXAMPLE: MAXIMALLY FAST BCH ENCODING

In order to understand the method according to the invention, the following example is presented. Thereafter is presented a hardware implementation.

According to the invention, an encoding system uses the "1's" and "0's" of the message vector m as a switching arbiter to enable the rows of a parity matrix to be "pushed out" and combined by a simple EXCLUSIVE OR function. These operations produce parity information which is concatenated to the message vector and then sent as part of the message on the communication channel. An example follows to clarify the operation.

Using the same example above, FIG. 2 represents a coding system 10 having received the message vector $m = 101$. The message vector is copied into a switch column buffer 24 along parity matrix 112. For the sake of the example, a "1" in the switch column buffer 24 implies that the same row in the parity matrix 112 will be "pushed" out by one column at a time to be evaluated by XOR gates 128, 228. A "0", conversely, disables the row pushing action and none of that particular row is sent to the XOR gates 128, 228. Specifically, the message vector m tells the switch column buffer 24 to enable the shifting outputs of rows 1 and 3 and to disable the outputs of row 2. At the same time the message vector m is loaded into switch column buffer 24, it is also loaded into shift register 20. A switch 121 is closed and a switch 122 is open.

On the next clock cycle, as in FIG. 3, the first bit A having value "1" of the message vector m is sent out to the channel from the shift register 20. The switch logic pushes the first bits of the parity matrix row onto the XOR array 128, 228 but inhibits the connection for row 2. The XOR function of column 1 bits of rows 1 and 3 produces a value "0". This is the first parity bit B of the message vector m. It is loaded through the switch 121 into the shift register 20 as bit B to be sent out onto the channel following the message vector m.

On the third clock cycle, as in FIG. 4, the second bit C having value "0" of the message vector m is sent from the shift register 20 out to the channel. The switch logic pushes the second bits of the parity matrix row onto the XOR array 128, 228 but continues to inhibit the propagation or connection for row 2. The XOR function of column 2 bits of rows 1 and 3 is "1". This is the second parity bit D of the message vector m, which is loaded into the shift register 20 to be sent to the channel following the message vector m.

On the fourth clock cycle, as in FIG. 5, the third bit E having a value "1" of the message vector m is sent out to the channel. The switch logic pushes the third bits of the parity matrix row onto the XOR array but inhibits the connection for row 2. The XOR of bits of column 3 of rows 1 and 3 is "1". This is the third and final parity bit F of the message vector m, which is loaded into the shift register 20 to be sent out onto the channel.

On the fifth clock cycle, as in FIG. 6, the first bit B of the parity word having value "0" is sent out to the channel. The switch logic of switch 122 is turned OFF so that no row pushing operation takes place while the switch column buffer 24 accepts a new arbitrary-valued message vector m=XXX. In the first position a bit G in the shift register 20 has a value X which is of no consequence to the previously-transmitted data stream.

On the sixth and seventh clock cycles, and more specifically at the seventh clock cycle, as shown in FIG. 7, the last bits D and F, having respective values "1" and "1", of the parity word, stand sent out to the channel. New message bits G, J and K are stored in the shift register 20. After the seventh clock cycle, switch 122 is turned ON again and the row pushing operation is enabled to begin computing parity information for the new message vector, m=XXX. The entire process repeats itself for each successive message word thereafter.

The above description provides a complete description of a representative operation according to the invention with a small number of bits. It illustrates the combining to produce the proper parity information without having to resort to massive ROM look up tables or complex buffering circuit schemes.

An encoder 100 (FIG. 8) or 200 (FIG. 9) in accordance with the invention can be implemented either by rotating the generator/parity matrix columns/rows within a ROM or by hardwiring the matrix. Both embodiments are illustrated. The basic principles may also be applied for hybrid architecture implementations.

COLUMN/ROW ROTATION

FIG. 8 represents an encoder 100 following the example using the column/row rotation. In this example, a parity ROM 12 contains the $3 \times 3 = 9$ bits of generator/parity matrix information. A column counter (COL CTR) 14 is a n-k state generator/parity matrix counter. Upon each count the COL CTR 14 addresses the generator/parity matrix ROM 12 to present the appropriate column of matrix information at the ROM outputs. The effect is equivalent to shifting and pushing the matrix rows through the AND gate switches 28, in the AND gate and switch latch 126 combination, and onto the XOR tree 18. Upon computing the proper parity information by this technique, each parity bit is serially shifted into a parity shift register 120 until all the parity bits have been computed. Thereafter, the parity shift register 120 changes to parallel shift mode and both the parity shift register and a message shift register 220 parallel shift their contents to a parallel-to-serial converter (PtoS) 320. A serial-to-parallel converter (StoP) 420 is provided at the input to receive the incoming serial bit stream and convert it to parallel data. At the appropriate time this parallel information is loaded and held in the switch latch 126 and message shift register 220 during the parity computation. All computations take place in real time prior to the block of information comprising the next incoming data input word.

When this architecture is extended to the (255,231) BCH code according to the invention, the resultant structure is a maximally fast yet compact encoder. More explicitly, the (255,231) code word design requires only (231 bit message $\times$ 24 bit parity word =) 5544 bits of generator/parity matrix information to be stored in ROM. The ROM information is sequenced through 231 AND gates and latch switches and 460 column XOR gates. The residual circuitry entails a StoP and PtoS converter, a 255-bit holding latch and minimal timing components.

HARDWIRED MATRIX

FIG. 9 illustrates an encoder 200 according to the invention embodied in a hardwired matrix apparatus. In this configuration it is still required to store the ($3 \times 3 =$) 9 bits of generator/parity matrix information. However, in order to take full advantage of an encoder 200 according to the invention, the information inputs of the AND gates 28 of the switch are tied to a logical "1" or "0" corresponding to the column/row information of the generator/parity matrix. Therefore, no clocking of the ROM columns is required, and the speed at which the parity information is generated is strictly dependent upon the propagation delay of the XOR gate array. Once again, the input data stream enters through a serial to parallel converter 420. The outputs of the StoP 420 connect to the AND gates 28 which form a switch which has the equivalent of permitting or inhibiting the row information fed to the XOR array. Simultaneously, the StoP 420 outputs are latched into a message shift register 220. The parity information is thereupon computed by allowing the message word to propagate through the bank of XOR gates 18. Once the propagation is complete, the parity information is loaded into the parity shift register 120, and the contents of both the message shift register 220 and the parity shift register are shifted out to the PtoS 320.

Extending this architecture to the (255,231) BCH code according to the invention requires (231×24=)5544 bits of generator/parity matrix information or 5544 AND gates, ((460 XOR gates/-column)×24 parity bits)=11,040 gates, which is readily realizable in current technology. The residual circuitry entails a StoP converter and a PtoS converter, a 255-bit holding latch and minimal timing components.

It is clear from both of the embodiments of FIG. 8 and FIG. 9 that the (255,231) BCH code used in this fashion produces a sufficiently low gate count to allow it to be easily integrated onto silicon.

A prototype of an embodiment of the invention was built of emitter coupled logic (ECL) components. A block diagram of the prototype is shown in FIG. 10. A serial to parallel converter 420 receives as input a single bit wide data stream. A timing block 421 provides an end of frame or sync pulse signal on line 422, an initial low rate input clock (for clocking the data without parity added) on line 423 and a bit-slip command signal (to account for the end of a code word which is not a multiple of the converter size, e.g., eight bits) on signal line 424. The converter 420 shifts 8 bits at a time into a first byte-oriented shift register 425. The register 425 may have its bit locations numbered 0 to 7 for the first byte up to 224 to 231 for the 29$^{th}$ byte. The timing block 421 provides a $\frac{1}{8}$ frequency clock as input for an 8-bit wide shift register via signal line 425.

Once the first shift register 425 has been fully loaded, the frame sync signal 422 directed to second shift register 427 and through an inverter 428 to a third shift register 429 causes alternately the second shift register 427 or the third shift register 429 to be loaded with the entire content of the first shift register 425 via 231-bit wide bus 430. Thus, either the second shift register 427 or the third shift register 429 contain an image of the content of the first shift register 425.

As soon as the second or third shift register 427 or 429 is loaded, its parallel content is directed via a third bus 431 or a fourth bus 432 to a multiplexer 433 whereby one or the other of the 231-bit wide words is sent to address inputs of a ROM (Read Only Memory) 434 on a bus 435. The ROM 434 contains the data comprising the parity matrix having been precomputed according to the invention. A data output bus 436 (which is effectively 208 bits wide) is provided from the ROM 434 to a tree 18 of EXCLUSIVE-OR gates. The ROM 434 in the prototype is constructed of components which require that the output be multiplexed internally and pipelined to shift out 208 bits in three cycles into the tree 18. The output of the tree 18 is directed via an eight-bit wide bus 438 to a multiplexer 441 to either of two parallel/serial hybrid shift registers 439 and 440. The purpose of these two shift registers is to capture eight bits at a time and then to add serially any excess bits to the data group to match the desired code word length for the parity portion of the output code word. Timing from the timing block 421 controls the parallel loading of three bytes and the serial shifting to add a single bit to account for the odd code word length and the parallel output shifting in eight-bit byte-oriented groups to the shift registers 427 and 429. The bytes are propagated alternately through the second shift register 427 or the third shift register 428 to a parallel to serial converter 320 through the 255$^{th}$ bit, after which a single bit shift adds the 256$^{th}$ bit. The second and third shift registers 427 and 429 load and shift according to complementary timing based on the end of frame clock on signal line 422. This is a so-called ping pong mode of operation which speeds throughput.

The first shift register 425 is optionally to be omitted where is more convenient to load input data alternately directly into the second or third registers 427 or 429. The entire device can be built in a custom integrated circuit, thereby eliminating the restriction to byte-oriented hardware. However, if it is further desireable to eliminate bit slipping to add odd bits, the shift register structure of FIG. 11 could be adopted. This would allow a designer to built a device which is limited only by the inherent speed limitations of the underlying technology.

FORMATTING AND DEFORMATTING FOR ODD CODE SIZE

As is apparent for a (255,231) code, the word sizes are non-binary and therefore cumbersome to use when constructing hardware using complex byte-oriented (8-bit unit) standard components. For example, an attempt to convert data serial-to-parallel using an incoming 231-bit stream, or to convert parallel-to-serial using an output 255-bit stream becomes quite awkward when using standard 8-bit serial-to-parallel or parallel-to-serial converters, particularly due to the nondivisibility of the large word size by 8.

To solve this problem, a common denominator was found for both the 231 and 255 bit streams. For example, consider an incoming 231-bit data word. The number 231 is divisible by 11, i.e. 231/11=21. This means that a 231-bit word can be represented as twenty-one 11-bit words shifted serially. Since it is preferable to use standard 8-bit serial-to-parallel converters, 8-bits must be able to divide 231 equally or it will be quite difficult to trace the beginning of each 231 bit word. Since 8×11=88 is divisible by 8 and 11, and 11 can divide into 231 evenly, a solution follows. The cost of such a solution will be 88-bits of buffering.

Referring to FIG. 11, which illustrates a converter 500 constructed of 8-bit units, 8-bit parallel information is continuously fed to eleven 8-bit wide shift registers 400. Once the 11×8 shift registers 400 are full with 88-bits of incoming information, that information is immediately (flash) dumped to an eight by 11-bit wide 88-bit shift register bank 402. The Serial to Parallel converter 420 continues to load the 11×8 shift register bank 400 and the above process continues.

Eventually the twenty-one 11-bit shift registers of bank 402 are filled with a full 231 bits of information. Once this occurs the 231-bit word is dumped and latched to compute the parity information as described by the techniques suggested in connection with FIG. 8 or FIG. 9.

If a 255-bit output is desired, then 15 divides into 255 evenly, 255/15=17, and it is noted that 8×15=120. Therefore, to deformat back to a standard 8-bit parallel-to-serial converter, the newly coded word ((231 message bits)+(24 parity bits))=255 bits, is translated to seventeen 15-bit wide shift registers. When the last 120-bits or 8×15 bits of an eight by 15-bit wide shift register bank is full, the resultant 120 bits are dumped to a 15×8, fifteen by 8-bit wide shift register bank that can now be shifted out to a standard 8-bit parallel-to-serial converter. It should be understood that a complementary structure, augmented to accommodate the increased word size as a result of the appending of the parity, is needed in the system in order to reformat the word prior to its output to the output data channel.

Although this procedure appears quite simplistic, it is vital to making the entire system feasible for use with odd code sizes, and it eliminates the need to slow down the StoP or PtoS converters which would otherwise be required to perform complex odd-sized bit slipping operations without breaking the incoming real-time bit stream.

The specific embodiment of the invention as described above has been built and tested at data rates in the range of 1 GBPS. Substantially higher rates could be achieved by increasing the size of the data chunks from sixteen bits to thirty-two bits, for example. Conventional CMOS, TTL and ECL integrated circuits have been employed, with GaAs circuits used only for the serial/parallel conversions.

Attached as Appendix A is the source code for a syndrome generation processor for a (255,231) BCH code. This processor is used to generate the syndrome used in the present invention.

Appendix A

SYNDROME GENERATION PROCESSOR FOR A (255,231) BCH CODE

Copyright © 1988 Ford Aerospace Corporation

```
c This is the program that calculates all ROM entries for the
c 255,231 BCH codes.  It is used to produce the ROM coding for
c the actual hardware as well as the ROM coding used for
c the Silicon Graphics (SG) simulations.

c The polynomial used to produce the Galois field GF(256)
c
c          8    4    3    2
c   435 = x  + x  + x  + x  + 1
c c The generator polynomial is
c
c              24    23    21    20    19    17    16    15
c   156720665 = x  + x  + x  + x  + x  + x  + x  + x  +
c
c        8    7    5    4    2
c     + x  + x  + x  + x  + x  + 1
c
c
      integer*2 alpha(8,255),syngen(24,255),modpol(9),intpow(255)
     1 ,temp(8),genpol(25),messag(231),erstrm(255),syndro(24)
     2 ,fxstrm(255),instrm(255)
      integer*4 rompos,s1,s3,s5,sh3,sh5,iran(4)
      character*1 e1s1(65536),e2s1(65536),e3s1(65536),efls1(65536),
     1 e1s0(65536),e2s0(65536),e3s0(65536),efls0(65536)
      real*8 randx do 10 i=1,9
      modpol(9)=0
   10 continue
      modpol(9)=1
      modpol(5)=1
      modpol(4)=1
      modpol(3)=1
      modpol(1)=1
      call alfill(alpha,intpow,modpol)
      call svfill(alpha,syngen)
      call syncal(syngen)
      call shfsyn(intpow,alpha)
      call errloc(modpol,alpha,intpow,syngen,e1s1,e2s1,e3s1,efls1,
     1 e1s0,e2s0,e3s0,efls0)
      call shfbak(intpow)
      do 120 i=1,25
      genpol(i)=0
```

```
    120 continue
        genpol(25)=1
        genpol(24)=1
        genpol(22)=1
        genpol(21)=1
        genpol(20)=1
        genpol(18)=1
        genpol(17)=1
        genpol(16)=1
        genpol(14)=1
        genpol(9)=1
        genpol(8)=1
        genpol(6)=1
        genpol(5)=1
        genpol(3)=1
        genpol(1)=1
        call encrom(genpol)
        stop
        end subroutine encrom(genpol)
c This subroutine calculates the twelve different 2K by 1 byte
c ROMs which are used in the encoder to prduce the 24 parity check bits
c added to the 231 data bits to produce the 255 bit block.
c The ROM contents are written to 12 separate files named:
c
c
c       P1BH1.BIN
c       P1BLO.BIN
c       P1AHI.BIN
c       P1ALO.BIN
c
c       P2BHI.BIN
c       P2BLO.BIN
c       P2AHI.BIN
c       P2ALO.BIN
c
c       P3BHI.BIN
c       P3BLO.BIN
c       P3AHI.BIN
c       P3ALO.BIN
c
c The 3 MSBs of each ROM address are controlled by a counter which goes
c from 0 to 7.  The 8 LSBs of the ROM address are the byte from
c the incoming data stream.  In all cases, the first bit from the incoming
c data stream is the LSB.  The first byte from the data stream is used
c for PnALO (n=1,2,3).  The second byte goes to PnAHI, the next
c byte to PnBLO, the next to PnBHI.  The counter then increments by 1
c and we return to ALO.  Note that after the first 231 bits (numbered
c 0 to 230) there are no more bits: the ROMs are programmed so as to
c ignore any bits beyond that point.  The outputs of the ROMs must be
c exclusive ORed cumulatively to produce the 24 parity bits.  Bits
c 231 to 238 come from P1***; bits 239 to 246 come from P2***; bits
c 247 to 256 come from P3***.  The tag bit number 255 (the 256th bit
c since we start numbering with 0) is not calculated by these ROMs.
        integer*2 temp(8),genpol(25),messag(231),instrm(255)
        integer*4 p1,p2,p3
        open(11,file='p1alo.bin',status='new',form='binary')
        open(12,file='p1ahi.bin',status='new',form='binary')
        open(13,file='p1blo.bin',status='new',form='binary')
        open(14,file='p1bhi.bin',status='new',form='binary')
        open(21,file='p2alo.bin',status='new',form='binary')
        open(22,file='p2ahi.bin',status='new',form='binary')
        open(23,file='p2blo.bin',status='new',form='binary')
```

```
      open(24,file='p2bhi.bin',status='new',form='binary')
      open(31,file='p3alo.bin',status='new',form='binary')
      open(32,file='p3ahi.bin',status='new',form='binary')
      open(33,file='p3blo.bin',status='new',form='binary')
      open(34,file='p3bhi.bin',status='new',form='binary')
      do 100 i=1,8
      do 120 j=1,8
      temp(j)=0
120   continue
      do 110 j=1,256 do 140 k=1,231
      messag(k)=0
140   continue
      do 150 k=1,8
      if(k+32*(i-1).le.231)messag(k+32*(i-1))=temp(k)
150   continue
      call encode(messag,instrm,genpol)
      ipow=1
      p1=0
      p2=0
      p3=0
      do 160 k=1,8
      p1=p1+instrm(231+k)*ipow
      p2=p2+instrm(239+k)*ipow
      p3=p3+instrm(247+k)*ipow
      ipow=ipow*2
160   continue
      write(11)char(p1)
      write(21)char(p2)
      write(31)char(p3)

do 240 k=1,231
      messag(k)=0
240   continue
      do 250 k=1,8
      if(k+32*(i-1)+8.le.231)messag(k+32*(i-1)+8)=temp(k)
250   continue
      call encode(messag,instrm,genpol)
      ipow=1
      p1=0
      p2=0
      p3=0
      do 260 k=1,8
      p1=p1+instrm(231+k)*ipow
      p2=p2+instrm(239+k)*ipow
      p3=p3+instrm(247+k)*ipow
      ipow=ipow*2
260   continue
      write(12)char(p1)
      write(22)char(p2)
      write(32)char(p3)
      do 340 k=1,231
      messag(k)=0
340   continue
      do 350 k=1,8
      if(k+32*(i-1)+16.le.231)messag(k+32*(i-1)+16)=temp(k)
```

```
350 continue
    call encode(messag,instrm,genpol)
    ipow=1
    p1=0
    p2=0
    p3=0
    do 360 k=1,8
    p1=p1+instrm(231+k)*ipow
    p2=p2+instrm(239+k)*ipow
    p3=p3+instrm(247+k)*ipow
    ipow=ipow*2
360 continue
    write(13)char(p1)
    write(23)char(p2)
    write(33)char(p3)

do 440 k=1,231
    messag(k)=0
440 continue
    do 450 k=1,8
    if(k+32*(i-1)+24.le.231)messag(k+32*(i-1)+24)=temp(k)
450 continue
    call encode(messag,instrm,genpol)
    ipow=1
    p1=0
    p2=0
    p3=0
    do 460 k=1,8
    p1=p1+instrm(231+k)*ipow
    p2=p2+instrm(239+k)*ipow
    p3=p3+instrm(247+k)*ipow
    ipow=ipow*2
460 continue
    write(14)char(p1)
    write(24)char(p2)
    write(34)char(p3)

increment temp
    do 130 k=1,8
    temp(k)=1-temp(k)
    if(temp(k).eq.1)goto 110
130 continue 110 continue
100 continue
    close(11)
    close(12)
    close(13)
    close(14)
    close(21)
    close(22)
    close(23)
    close(24)
    close(31)
    close(32)
    close(33)
    close(34)
    return
    end
```

```
      subroutine encode(messag,instrm,genpol)
c This subroutine takes the 231 bit long input data messag and claculates
c 24 parity check bits to extend it to the 255-bit block instrm.
c genpol is the generating polynomial.
      integer*2 genpol(25),messag(231),instrm(255)
      do 100 i=1,255
      instrm(i)=0
100   continue
      do 200 i=1,231
      if(instrm(i).ne.messag(i))then
      do 300 j=1,25
      instrm(i+j-1)=iabs(genpol(j)-instrm(i+j-1))
300   continue
      endif
200   continue
      return
      end
```

The invention has now been described with reference to specific embodiments. Other embodiments will be apparent to those of ordinary skill in the art. For example, the invention has been described with respect to a particular type of BCH code. The invention can be modified to apply to special cases of error correcting codes having similar characteristics, such as Reed-Solomon codes, which are nonbinary subsets of BCH codes. In addition, the invention applies to a wide variety of linear cyclic invariant codes whose generator polynomials can be factored. However, it is believed that less than all such codes can be decoded in accordance with selected embodiments of the invention. It is therefore not intended that this invention be limited, except as indicated in the appended claims.

I claim:

1. An apparatus for encoding information according to a linear error correcting code having a generator matrix comprising an identity matrix and as associated parity matrix, said apparatus comprising:
   first means coupled to an input channel for storing an input data word of said linear error correcting code;
   matrix means for permanently storing a binary representation of the parity matrix for said linear error correcting code for use in computing parity of said input code word;
   means for controlling digital value output of said matrix means as a function of content of said first storing means;
   means for exclusive-OR combining content of said first storing means with said digital value output of said matrix means to generate a parity word for said input data word; and
   second means coupled to said input channel for storing said input data word of said linear error correcting code and said parity word, said second storing means being coupled to an output data channel for supplying said input data word and said parity word to said output channel.

2. The apparatus according to claim 1 wherein the error correcting code is selected from linear cyclic invariant error correcting codes whose generator polynomials can be factored, wherein said matrix means comprises a first Read Only Memory means storing only parity bits of the generator matrix of a code word in order to minimize storage of information.

3. The apparatus according to claim 1 wherein the error correcting code is selected from linear cyclic invariant error correcting codes whose generator polynomials can be factored, wherein said matrix means comprises an array of dual-input AND gates, each first input of said AND gates being tied to a fixed value storing parity bits corresponding to the parity matrix and each second input being coupled to one parallel output of said first storage means in order to minimize storage of information.

4. The apparatus according to claim 3 further including:
   means for converting serial data to parallel data of a code word not divisible by Y, said converting means comprising a first array of Y means for storing parallel data divisible by X, where X is a common factor to said code word, and a second array of X means for storing data divisible by Y, said second array being coupled to receive Y by X data from said first array as X by Y data.

5. The apparatus according to claim 1, wherein said parity matrix is a means for determining at least one syndrome, said apparatus further comprising means for modulo-2 adding partial parities of said at least one syndrome to obtain said at least one syndrome.

6. The apparatus according to claim 1 further comprising:
   a serial-to-parallel converter coupled to receive input data in order to convert high-speed input data into parallel data to be processed at lower data speeds, said serial-to-parallel converter being coupled to provide said parallel data to said parity matrix which is a syndrome determining means.

7. A method for encoding information according to a linear error correcting code having a generator matrix comprising an identity matrix and an associated parity matrix, said method comprising:
   storing an input data word of said linear error correcting code in a first storage means, said input data word being received through an input data channel;
   shifting selected bits of said input data word through a parallel shift register means as a function of parity of the parity matrix for said linear error correcting code to compute parity of said input code word in order to generate a digital value output;

exclusive-OR combining content of said first storing means with said digital value output to generate a parity word for said input data word;

appending said parity word for said input data word to said input data word of said linear error correcting code; and supplying said input data word and said parity word as a bit stream to an output channel.

8. The method according to claim 7 wherein the error correcting code is selected from linear cyclic invariant error correcting codes whose generator polynomials can be factored, wherein said shifting step comprises applying said input data word to a first Read Only Memory means storing only parity bits of the generator matrix of a code word in order to minimize storage of information.

9. The method according to claim 7 wherein the error correcting code is selected from linear cyclic invariant error correcting codes whose generator polynomials can be factored, wherein said shifting step comprises applying said input data word to an array of dual-input AND gates, each first input of said AND gates being tied to a fixed value storing parity bits corresponding to the parity matrix and each second input being coupled to one parallel output of said first storage means in order to minimize storage of information.

10. The method according to claim 9 further including the steps of:

converting serial data to parallel data of a code word not divisible by Y, said converting means comprising a first array of Y means for storing parallel data divisible by X, where X is a common factor to said code word, and a second array of X means for storing data divisible by Y, said second array being coupled to receive Y by X data from said first array as X by Y data.

11. The method according to claim 7 further comprising the step of:

modulo-2 adding partial parities of said at least one syndrome to obtain said syndrome.

12. The method according to claim 7 further comprising:

converting high-speed input data into parallel data to be processed at lower data speeds with a serial-to-parallel converter means, said serial-to-parallel converter means being coupled to provide said parallel data to said parity matrix which is a syndrome determining means.

* * * * *